United States Patent
Dai et al.

[11] Patent Number: 5,892,318
[45] Date of Patent: Apr. 6, 1999

[54] PIEZOELECTRIC TRANSFORMER WITH MULTIPLE OUTPUT

[75] Inventors: Xunhu Dai; James R. Phillips, both of Albuquerque, N. Mex.

[73] Assignee: Motorola Inc., Schaumburg, Ill.

[21] Appl. No.: 775,531

[22] Filed: Jan. 2, 1997

[51] Int. Cl.$^6$ ........................................ H01L 41/04
[52] U.S. Cl. .................... 310/358; 310/357; 310/359; 310/366
[58] Field of Search .................... 310/358, 366, 310/357, 359, 367, 328

[56] References Cited

U.S. PATENT DOCUMENTS

| | | | |
|---|---|---|---|
| 3,736,446 | 5/1973 | Berlincourt et al. | 310/8 |
| 4,054,806 | 10/1977 | Moriki et al. | 310/318 |
| 5,118,982 | 6/1992 | Inoue et al. | 310/366 |
| 5,241,236 | 8/1993 | Sasaki et al. | 310/358 |
| 5,278,471 | 1/1994 | Uehara et al. | 310/328 |
| 5,319,324 | 6/1994 | Satoh et al. | 331/158 |
| 5,341,061 | 8/1994 | Zaitsu | 310/318 |
| 5,394,048 | 2/1995 | Yamashita et al. | 310/316 |
| 5,440,195 | 8/1995 | Ohnishi et al. | 310/359 |
| 5,463,266 | 10/1995 | Fukuoka et al. | 310/359 |
| 5,504,384 | 4/1996 | Lee et al. | 310/359 |
| 5,576,590 | 11/1996 | Ohnishi et al. | 310/359 |

FOREIGN PATENT DOCUMENTS

| | | |
|---|---|---|
| 440734 | 1/1975 | Russian Federation . |
| 336702 | 12/1976 | Russian Federation . |

*Primary Examiner*—Mark O. Budd
*Assistant Examiner*—Timothy A. Williams
*Attorney, Agent, or Firm*—Gary J. Cunningham; Colin M. Raufer

[57] ABSTRACT

A piezoelectric ceramic transformer made from a piezoelectric ceramic material stacked in a multilayer package which has a driving section 502 formed by alternately stacking piezoelectric ceramic layers polarized in a direction of thickness of the piezoelectric plate. The driving section 502 has internal interdigitated electrode layers 504A, 504B for causing piezoelectric vibration by a driving voltage applied to an input terminal (Vin). A first driven section 506, also made from piezoelectric ceramic layers polarized in the longitudinal direction of the piezoelectric plate, for generating a first output voltage (Vout1) at a first output by the piezoelectric vibration transmitted from the driving section 502. A second driven section 510, made from piezoelectric ceramic layers polarized in the thickness direction of the piezoelectric plate, for generating a second output voltage (Vout2) at a second output by the piezoelectric vibration transmitted from the driving section 502. Thus, a piezoelectric ceramic multilayer transformer with a multiple output is created.

14 Claims, 5 Drawing Sheets

SECTION 4-4

SECTION 6-6

PIEZOELECTRIC TRANSFORMER WITH MULTIPLE OUTPUT

FIELD OF THE INVENTION

This invention relates to piezoelectric ceramic transformers, and more particularly to a piezoelectric transformer with multiple output.

BACKGROUND OF THE INVENTION

Piezoelectric transformers utilizing the piezoelectric effect are known in the art. A piezoelectric transformer can be defined as a passive electrical energy-transfer device or transducer employing the piezoelectric properties of a material to achieve the transformation of voltage or current or impedance. Piezoelectric transformers have recently replaced wound-type electromagnetic transformers for generating high voltage in the power circuits for certain electronic applications. These piezoelectric transformers offer numerous advantages over ordinary electromagnetic transformers including a compact and slim shape, rugged construction, and high reliability in a comparably smaller package.

Piezoelectric ceramic transformers are now finding applications in a variety of applications including photocopiers, backlights of liquid crystal displays (LCDs), flat panel displays (FPDs), power converters, CRT displays, field emission displays (FEDs), and the like. FIG. 1 shows the construction of a Rosen-type piezoelectric transformer, a representative example of a piezoelectric transformer of the prior art.

FIG. 1 shows a standard multilayer ceramic piezoelectric transformer 100 formed from a co-fired ceramic package 102 interspersed with layers of a conductive metallization electrode pattern 104. Although the package is made from layers of a green ceramic tape, upon firing the package sinters into a single ceramic structure. Consequently, all FIGS. will show the fired package and the individual layers of green tape will not be shown. A voltage (Vin) is applied across the electrode layers 104 creating a potential difference across the primary region 106. The primary region 106 is polarized in the direction of its thickness, as indicated by the arrows between the electrode layers 104 shown in FIG. 1. Polarization is a process wherein a very substantial direct current (DC) voltage, in the range of 4 kV/mm, is applied to the ceramic in order to give the material its piezoelectric properties. Similarly, a portion of the piezoelectric transformer 100 indicated by reference numeral 108 is a power generating or secondary section. An output (Vout) is formed on the end face 110 of transformer 100 corresponding to the power generating section 108. Note that the end face 110 is metallized with a conductive coating, as is the top surface 112 on the primary section 106 end of transformer 100. Electrode layers 104, internal to the multilayer package, are also made from a conductive coating material. The power generating section 108 is polarized in the lengthwise direction, as indicated by an arrow in FIG. 1.

With reference to FIG. 1, the basic operation of a piezoelectric transformer can be understood. When a voltage is applied to the primary section 106 of the piezoelectric transformer, the resulting electric field causes a vertical vibration due to a change in the thickness of the driving section 106 of the transformer. This vertical vibration results in a horizontal vibration in the lengthwise direction (also known as the piezoelectric transverse effect 31 mode) along the entire length of the transformer 100. In the power generating section 108 (also known as the secondary section), a voltage having the same frequency as that of the input voltage (Vin) is derived through the output electrode (Vout) in accordance with a piezoelectric effect wherein a potential difference occurs in the polarizing direction due to the mechanical strain in the polarizing direction. At this time, if the driving frequency is set to be the same as the resonant frequency of the piezoelectric transformer, a very high output voltage can be obtained. Stated another way, by applying an alternating current through the primary section 106 of a piezoelectric material, its thickness characteristics will vary, which through coupling, causes a change in length of the secondary section 108, which results in a change in the electrical output caused by an electromechanical effect.

FIG. 2 shows another prior art piezoelectric transformer in which the primary 206 and the secondary 208 sections of the piezoelectric ceramic plates are "stacked" vertically. Referring to FIG. 2, a stack-type transformer 200 is provided. Once again, a voltage (Vin) is applied to a primary 206 section through a series of metallized electrode layers 204, which in turn results in a high output (Vout) in the secondary 208 section due to a piezoelectric effect. Top surface 210 is covered with a conductive coating, and side surfaces 212 and bottom surface 214 are selectively metallized to achieve the desired transformer properties. In stacked transformer 200, all layers are polarized in the thickness direction as is designated by the arrows shown in FIG. 2.

One problem with the present technology is that a single piece of electronic equipment may contain multiple transformers, each with its own drive circuit, and each with its own output voltage. Thus, by providing multiple outputs in a single transformer design, a substantial reduction in both size and weight may be realized. Additionally, greater integration is possible in a multiple output transformer having a single drive circuit with a small footprint. Finally, by decreasing the overall number of transformers in a single piece of electronic equipment, a cost savings is also obtained. Another problem with these transformer designs, and all other piezoelectric transformers in the field, is the fact that they have only a single driven section (power generating section) resulting in only a single output voltage. However, system designers for various applications are demanding multiple output voltage capabilities. A novel ceramic piezoelectric transformer structure which offers multiple driven sections resulting in multiple outputs wherein a single a input voltage drives two or more output voltages would be considered an improvement in the art.

DETAILED DESCRIPTION OF THE PREFERRED EMBODIMENT

Figure 1A:
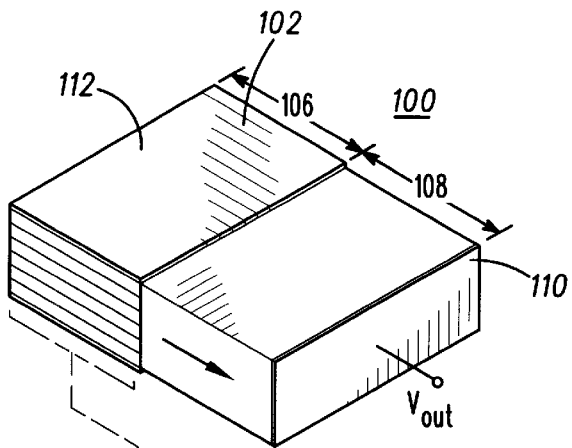
FIG. 1 shows an embodiment of a prior art Rosen-type piezoelectric transformer.
Figure 1B:
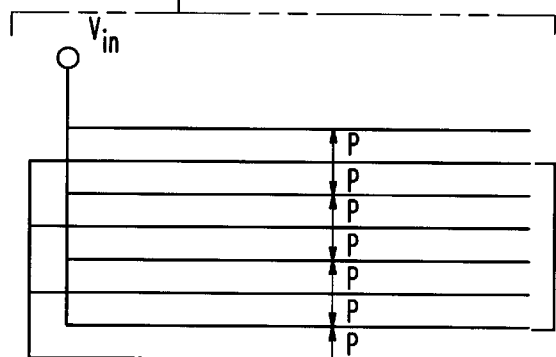
Figure 2A:
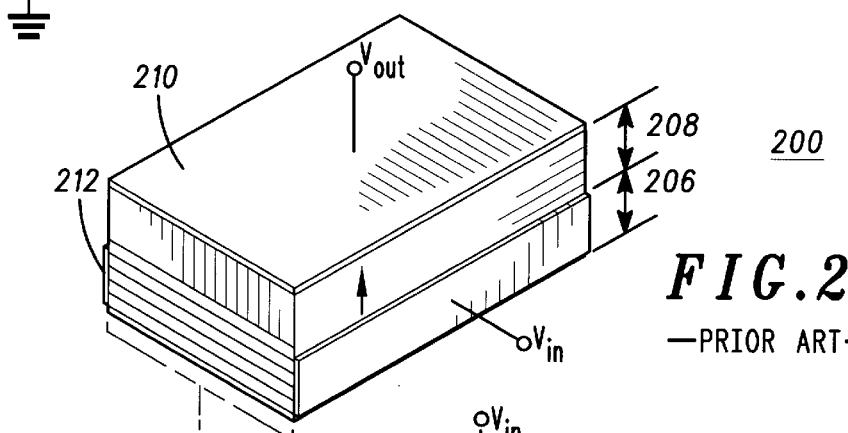
FIG. 2 shows another embodiment of a prior art Stacked-type piezoelectric transformer.
Figure 2B:
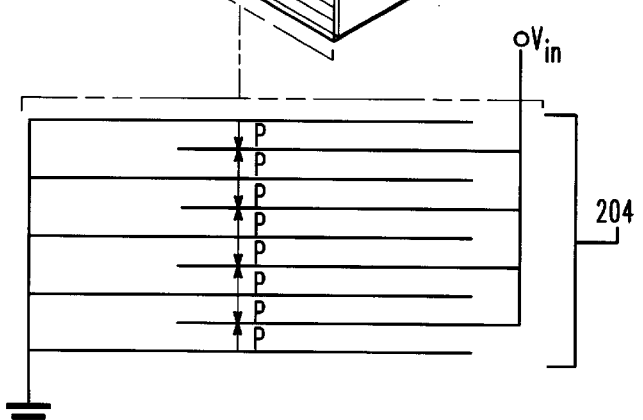
Figure 3A:
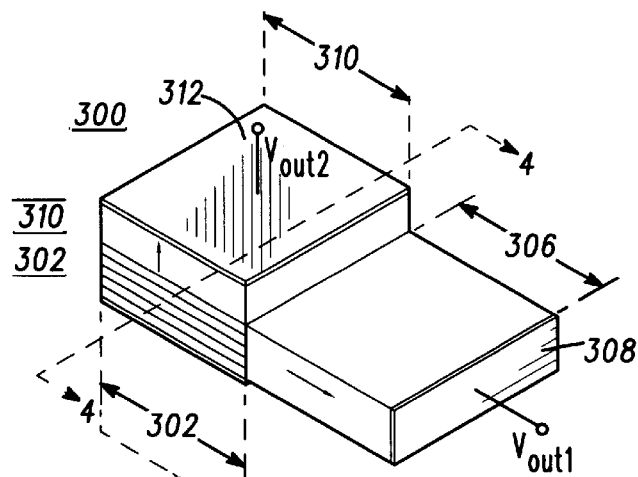
FIG. 3 shows a perspective view of a piezoelectric transformer with multiple output configuration in accordance with the present invention.
Figure 3B:
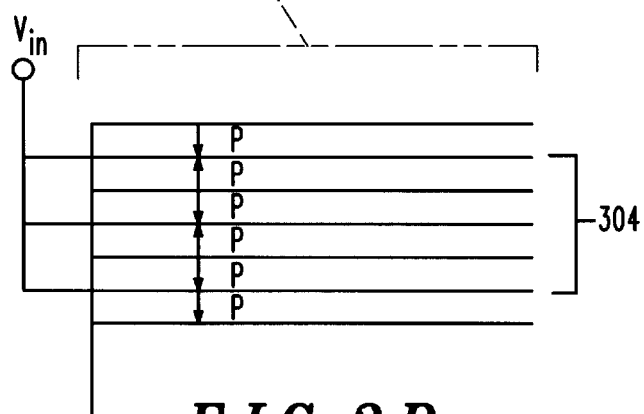

The present invention can be best understood with reference to FIGS. 3–10. In FIG. 3, a piezoelectric transformer 300 with a multiple output configuration is provided. In this embodiment, the transformer is made from a plurality of stacked layers of green ceramic tape, which upon firing sinter into a dense block of ceramic material called a fired package. FIGS. 3–10 will all show fired packages in which the individual layers of green tape ceramic will not be shown.

A driving section 302 is provided and operates when a voltage (Vin) is applied across a set of electrode layers 304 creating a potential difference in the driving region 302. The driving region 302 is polarized in the direction of its thickness, as indicated by the arrows between the electrode layers 304 shown in FIG. 3. Similarly, a portion of the piezoelectric transformer 300 indicated by reference numeral 306 is a first driven section (also known as first power generating section).

This piezoelectric transformer 300 can be fabricated by a multilayer ceramic technology such as a tape casting method. Using conventional ceramic multilayer technology, internal electrodes 304 can be placed between the layers of ceramic green tape, and the entire package can be co-fired in a single operation. Since the driving section 302 and the first driven section 306 of the transformer 300 are made from the same green sheets of ceramic, the electrode layers 304 are strategically patterned such that a transformer 300 having no internal electrodes 304 in its first driven section 306 can be fabricated. In simpler terms, the electrode layers 304 are placed between the sheets of ceramic green tape only in the driving section 302 of the transformer 300.

A first output (Vout1) is formed on the end face 308 of the piezoelectric transformer 300 corresponding to the first driven section 306 and the first driven section 306 is polarized in the lengthwise direction, as indicated by an arrow in FIG. 3. The output voltage (Vout1) is generated by the piezoelectric vibration transmitted from the driving section 302.

An important feature of the present invention involves the introduction of a second driven section 310 in FIG. 3. As is shown in FIG. 3, the second driven section 310 rests immediately above the driving section 302 and is similarly made from plurality of piezoelectric ceramic green sheet layers having no electrode layers therebetween. This forms a stepped piezoelectric plate. Note that second driven section 310 is also polarized in the thickness direction, as is shown by the arrow on transformer 300 in FIG. 3. Note also that the top surface 312 of the second driven section 310 is metallized with a conductive coating and forms a second output voltage (Vout2). The ability of the transformer 300 to generate two distinct voltage outputs, (Vout1) and (Vout2) respectively, provide the multiple output configuration of the present invention.

One possible application for a piezoelectric transformer having multiple outputs would be for use in a portable laptop computer. A single input voltage in the range of 3–5 volts may be desirably transformed into multiple outputs, namely a high voltage (Vout1) used for a backlight for the computer screen, and a second lower voltage (Vout2) used for the disc drives of the computer, for example. Other complicated pieces of electronics, such as televisions, computers, flat panel displays, electronics for automobiles, and other related electronic applications may have a need for a piezoelectric transformer with multiple outputs.

The piezoelectric ceramic materials contemplated in the present invention are numerous. Any piezoelectric ceramic material that can be processed into a tape that can be made into a multilayer package is within the scope of this invention. Typically, the piezoelectric ceramic material used to manufacture the transformer will be either lead titanate, lead titanate-lead zirconate (PbZrO3-PbTiO3), barium titanate, lithium niobate, or equivalents thereof.

Many titanate materials can be processed to exhibit piezoelectric properties. In a preferred embodiment, a lead titanate-lead zirconate (PbZrO3-PbTiO3) material may be used, which will also contain appropriate organic binders and plasticizers. The lead titanate-lead zirconate material is desirable because of its piezoelectric properties, easy processing, and good electrical and mechanical characteristics. The electrode material is typically a platinum (Pt) paste and internal electrodes are formed by screen-printing a paste on the green sheet of the piezoelectric material and sintering the paste together with the piezoelectric material. Other electrode material possibilities include silver (Ag) or gold (Au). Of course, the materials and processing steps described above are exemplary only and are not intended to limit the scope of this invention.

Oftentimes, a variety of materials issues will effect the decision as to which material to use for a specific application. For example, the coupling coefficients, PZT properties, mechanical or electrical loss properties may make some materials desirable over other materials for specific applications. Materials issues and material selection will be another design variable which will be specific to each application.

It is also contemplated that the transformer of the present invention can be a reciprocal device and that it can therefore be connected substantially in reverse such that the electrical inputs and outputs are switched. This would be desirable in instances where multiple inputs advantageously lead to a single electrical output. In this instance, the transformer would have multiple driving sections and a single driven section.

Another feature of transformer 300 (which provides for much flexibility) is that it can be either a step-up or a stepdown type transformer. The voltage ratio between the driving and driven sections of the transformer determine which design will be implemented. In a preferred embodiment, a step-up type transformer in which a higher output voltage, relative to the input voltage, is desired. This is desirable to meet the high output requirements of a backlight for a computer screen, or a flat panel display (FPD), for example.

The step-up or step-down ratios can vary greatly. In a preferred embodiment, a step-up ratio of 1 to 100 may be desirable for applications as an electron emitter in a field An emission display (FED). In a similar application, a step-up ratio of 1 to 10 may be desirable where a lower step-up voltage is required, such as in connection with a column-row driving voltage for a display panel. The transformer 300 is adapted for use in these and similar applications. For many applications, complex electronics will require one output (Vout1) with a very high voltage relative to the input (Vin), and still other outputs (Vout2 and Vout3) that are only slightly higher in voltage relative to the input (Vin).

Figure 4:
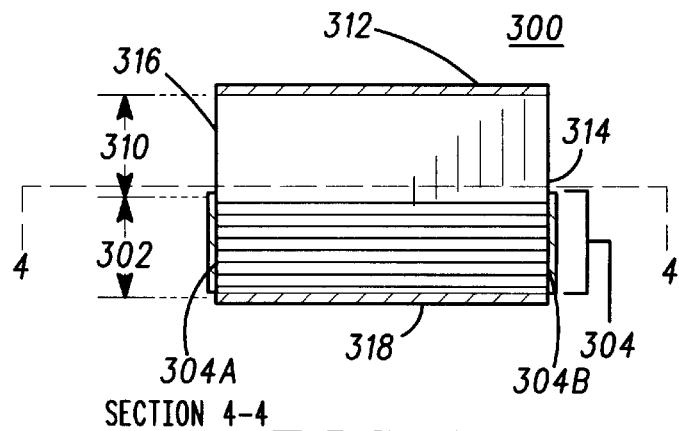
FIG. 4 shows a cross-sectional view, along axis 4—4 of FIG. 3, in accordance with the present invention.

FIG. 4 shows a cross-sectional view, along axis 4—4 of FIG. 3. In FIG. 4, the electrode layers 304 can be viewed in detail. From this view, the interdigitated electrode layer 304 structure can be better explained. During the piezoelectric ceramic multilayer transformer fabrication process, the strategic patterning of the electrode layer 304 provides for no patterning of electrode metallization on the driven sections of the transformer and also an "offset" pattern design between successive layers of ceramic green tape. Thus, alternate electrode layers will, as result of the offset patterning, form two distinct electrical paths 304A and 304B respectively, which are connected to opposite side surfaces, 314 and 316 respectively, of the piezoelectric transformer 300 as shown in FIG. 4. An input voltage (Vin) creates a potential difference between 304A and 304B in the driving portion 302 of the piezoelectric transformer 300. The bottom surface 318 of the driving section 302 of the piezoelectric transformer 300 is substantially covered with a conductive coating (electrode) material.

Transformer 300 can resonate at any predetermined periodic interval at a predetermined frequency, depending on the application. For example, the transformer 300 may resonate as a half-wave resonator, a full-wave resonator, or a one-and-half wave resonator, depending upon the design. This may result in designs which are different from those shown on FIGS. 3–10, wherein the driving and the driven sections are split within the package itself, leading to a variety of electrical input and output configurations. Any such design, which incorporates the multiple output feature of the present invention, is within the spirit and scope of the present invention.

The choice of how to set the resonance of the transformer (i.e. half-wave resonator, full-wave resonator, or one-and-half wave resonator) is another design consideration which is application specific. Typically, the piezoelectric transformer will be mounted at the nodal points, using conventional piezoelectric transformer mounting techniques. However, due to the inherent vibration of all piezoelectric devices, mounting can become an important design consideration.

A half-wave resonator design offers the advantage of a low frequency, which may be desirable for certain applications such a flat panel display (FPD). A potential problem of a half-wave resonator design is that mounting may only occur at one location.

A full-wave resonator design offers the advantage of better efficiency because the node is in the center of the driven area. As a result, better stress concentrations occur when there are two mounting points. In a full-wave resonator design, the circuit would need to be driven at twice the frequency compared to a half-wave resonator design.

In another embodiment, with a one-and-one-half wave resonator design (in which there are two driving sections) advantages in terms of more power and greater efficiency than the other designs are possible. However, the two driving sections can also require a complex electroding configuration which may require more circuitry on the board to which the transformer is mounted. Overall, the resonator design will be application specific.

Figure 5A:
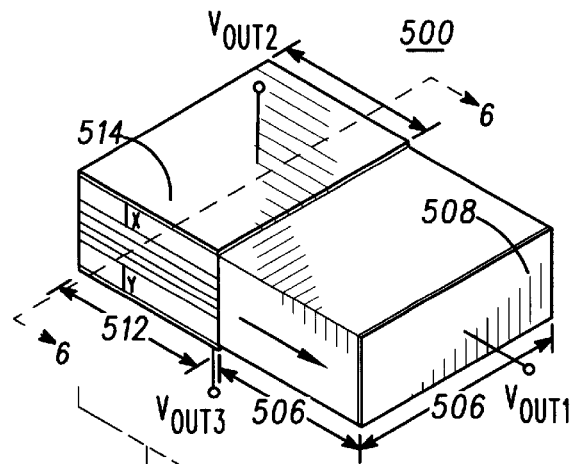
FIG. 5 shows a perspective view of another embodiment of the piezoelectric transformer with multiple output configuration in accordance with the present invention.
Figure 5B:
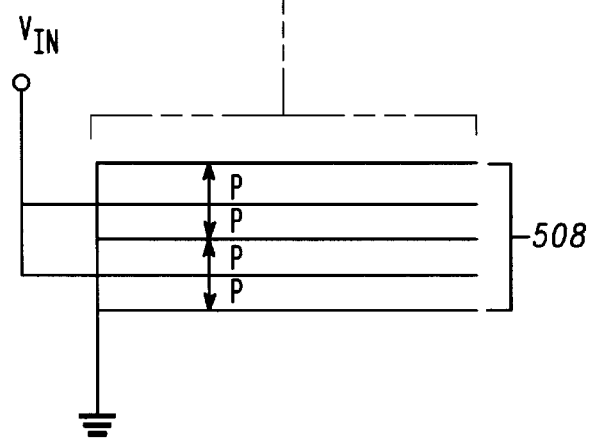

FIG. 5 shows a perspective view of another embodiment of the piezoelectric transformer with multiple output configuration. From this embodiment, various different aspects and features of the present invention will be discussed.

FIG. 5 shows an embodiment of a piezoelectric transformer 500 wherein the driving region 502 is made up of a plurality of alternately stacked sheets of green ceramic tape interspersed with electrode layers 504, and the driving section 502 is located in the middle portion of one end of the piezoelectric transformer 500 package. The driving section 502 is provided and operates when a voltage (Vin) is applied across the electrode layers 504. The driving region is polarized in the direction of its thickness, as indicated by the arrows between the electrode layers 504 shown in FIG. 5.

A first driven section 506 (also known as a first power generating section) is provided at the other end of piezoelectric transformer 500. Transformer 500 can be fabricated using the same multilayer technology discussed in FIGS. 3 and 4. A first output (Vout1) is formed on the end face 508 of the piezoelectric transformer 500, face 508 also being completely metallized with a metallized conductive coating material. First driven section 506 is polarized in the lengthwise direction, as indicated by the arrow in FIG. 5. The output voltage (Vout1) is generated by the piezoelectric vibration transmitted from the driving section 502.

In this embodiment, a second driven section 510 and a third driven section 512 are introduced, resulting in a second output voltage (Vout2) and a third output voltage (Vout3), respectively. Second driven section 510 rests immediately adjacent or atop driving section 502 and third driven 512 section rests immediately below driving section 502. Stated another way, the second driven section 510 and the third driven section 512 are latitudinally adjacent driving section 502.

The top surface 514 of the second driven section 510 is metallized with a conductive coating material. It is from this region that the second output voltage (Vout2) is drawn. Similarly, the bottom surface 516 of the third driven section is also metallized with a conductive coating material. It is from this region that the third output voltage (Vout3) is drawn.

The multiple output configuration of this embodiment leads to some interesting electrical coupling possibilities which are directly related to and dependent upon the polarization characteristics of the second and third driven sections, 510 and 512 respectively. A piezoelectric transformer having multiple outputs, such as transformer 500 shown in FIG. 5, may have some or all of its three separate and distinct outputs connected electrically in series or parallel. By connecting the output voltages in parallel, the overall power output is increased. By connecting the output voltages in series, the overall voltage is increased. Either of these conditions may be desirable for specific applications.

Referring to FIG. 5, in order to connect the second output voltage (Vout2) and the third output voltage (Vout3) in series, both the second driven region 510 and the third driven region 512 will have to be polarized in the same direction, namely toward the top surface 514 of the piezoelectric transformer 500. In FIG. 5, regions X and Y will both have A arrows pointing in the direction of the top surface 514 of the transformer 500. It should also be noted that in order for the output voltages (Vout1, Vout2, and Vout3) to be connected in series, it is a prerequisite that they have substantially the same phase.

In order to connect the second output voltage (Vout2) in parallel with the third output voltage (Vout3), the polarization scheme would be slightly different. In this embodiment, both the second driven section 510 and the third driven section 512 will be polarized in their thickness direction, however, each driven section will be polarized in a direction toward its respective side surface. In FIG. 5, region X will have an arrow pointing toward top surface 514, whereas region Y will have an arrow pointing toward the bottom surface 516 of the piezoelectric transformer 500.

Another aspect of the present invention involves the relative thickness and corresponding volumes of the second driven section 510 and the third driven section 512. In FIG. 5, regions X and Y are shown to be substantially the same thickness. In practice, it may be desirable to vary the thickness of the driving section 502 and the second driving section 510 and the third driving section 512, however in a preferred embodiment, they will be substantially the same. The actual design choices as to the number of output voltages desired, number of layers or sheets of ceramic green tape, and the metallization pattern will be dependent on the specific application.

One application for the piezoelectric transformer with multiple output could be a field emission display (FED) application, which can better be understood with reference to FIG. 5. For this application, a transformer may be desirable which can have an input voltage in the range of about 3–5 volts, which can be transformed into three separate and distinct output voltages in the range of about 1,000 to 10,000 volts (1–10 kV) for a first output (Vout1), a second output (Vout2) in the range of 10–100 volts, and a third output (Vout3) in the range of 10–100 volts. Such a transformer could be made from a lead titanate-lead zirconate ceramic material in a package having ten sheets of ceramic green tape.

Figure 6:
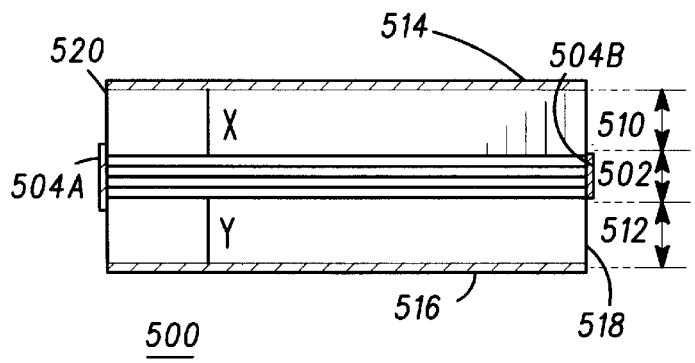
FIG. 6 shows a cross-sectional view, along axis 6—6 of FIG. 5, in accordance with the present invention.

FIG. 6 shows a cross-sectional view, along axis 6—6 of FIG. 5. In FIG. 6, an interdigitated electrode configuration can be seen in which an alternate electrode layers 504A and 504B are connected to opposite side surfaces of the transformer 518 and 520, respectively. Side surfaces 518 and 520 are selectively metallized to allow for the necessary electrical grounding of the transformer 500.

Figure 7A:
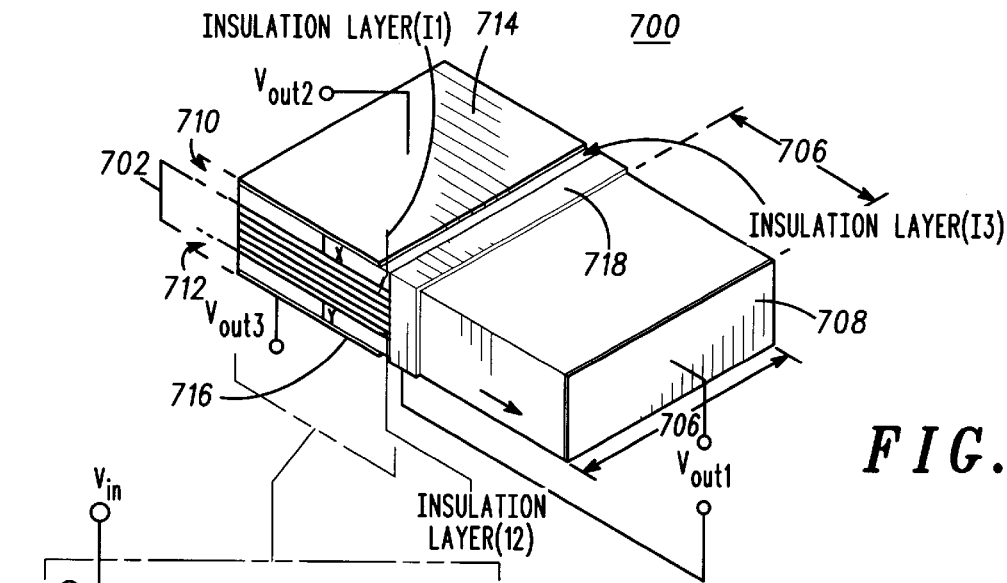
FIG. 7 shows a perspective view of another embodiment of the piezoelectric transformer with multiple output configuration in which there are various insulation layers between the driving section and the driven sections, in accordance with the present invention.
Figure 7B:
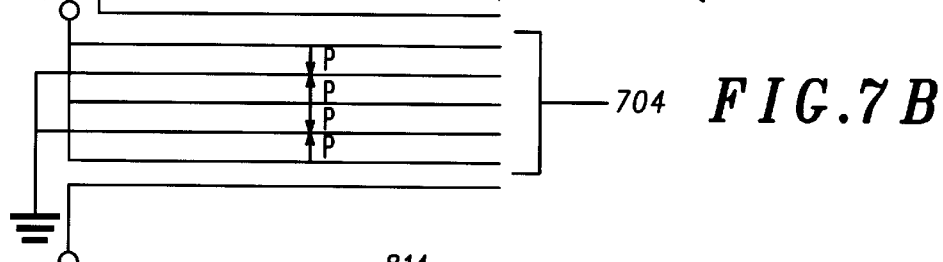

FIG. 7 shows a perspective view of another embodiment of a piezoelectric transformer 700 with multiple output configuration in which there are various insulation layers between the driving and driven sections. In FIG. 7, an embodiment of a piezoelectric transformer 700 is provided wherein the driving region 702 is made up of a plurality of alternately stacked sheets of green ceramic tape interspersed with electrode layers 704, and the driving section 702 is located in the middle portion of one end of the piezoelectric transformer package 700. The driving section 702 is provided and operates when a voltage (Vin) is applied across the electrode layers 704. The driving region is polarized in the direction of its thickness, as indicated by the arrows between the electrode layers 704 shown in FIG. 7.

A first driven section 706 (also known as a first power generating section) is provided at the other end of piezoelectric transformer 700. Transformer 700 can be fabricated using the same multilayer technology discussed in FIGS. 3 through 6. A first output (Vout1) is formed on the end face 708 of the piezoelectric transformer 700, face 708 also being completely metallized with a metallized conductive coating material. First driven section 706 is polarized in the lengthwise direction, as indicated by the arrow in FIG. 7. The output voltage (Vout1) is generated by the piezoelectric vibration transmitted from the driving section 702.

In this embodiment of the invention, a second driven section 710 and a third driven section 712 are introduced, resulting in a second output voltage (Vout2) and a third output voltage (Vout3), respectively. Second driven section 710 rests immediately adjacent or atop driving section 702 and third driven 712 section rests immediately adjacent or below driving section 702. The top surface 714 of the second driven section 710 is metallized with a conductive coating material. It is from this region that the second output voltage (Vout2) is drawn. Similarly, the bottom surface 716 of the third driven section is also metallized with a conductive coating material. It is from this region that the third output voltage (Vout3) is drawn. The discussion of polarization and connecting these multiple outputs in electrical series or parallel is the same as was discussed in FIG. 5 and is incorporated by reference herein.

A unique feature of the present invention, which can be seen in FIG. 7, involves the introduction on electrical isolation layers (11, 12, and 13) throughout the piezoelectric transformer 700. Referring to FIG. 7, when the outermost electrode layers 704 of the driving section 702 of the transformer 700 are electrically isolated, isolation layers 11 and 12 are formed. These layers serve the purpose of electrically isolating the driving section 702 from the second driven section 710 and the third driven section 712, respectively. This design can be used for those applications where it is desirable to electrically isolate the input and the output.

Another isolation layer formation method is used to create the third isolation layer 13. In FIG. 7, a thin metallization strip 718 is placed around all exterior surfaces of the piezoelectric transformer 700, in the first driven section 706. As such, an electrical isolation layer 13 is created which is electrically equivalent to the isolation layers 11 and 12 discussed previously. In a preferred embodiment, the thickness of this metallization strip 718 will be substantially the same as the thickness of the isolation layer 13 that it creates. The use of any type of strategically placed isolation layer which is electrically isolated and involves the use of an isolation layer or metallization strip is within the scope of this invention.

The introduction of an isolation layer, as shown in FIG. 7 and described above, can be achieved with minimal changes to the design of the transformer itself. Referring to FIG. 7, by introducing outputs 720 and 722, the isolation layers 11 and 12 respectively, are created. A typical isolation layer application would be to meet the requirement for a floating voltage, whereby there is no direct connection of the input and output voltages.

Conventional transformers share a common input or output voltage. In a multilayer piezoelectric transformer, true isolation may be achieved such that an output is totally isolated from both the input as well as the other outputs. While there will always be an electrical connection between the input supply and output, there will be no direct current (DC) connection between the input and the output when the isolation layer is designed into the piezoelectric transformer.

Figure 8A:
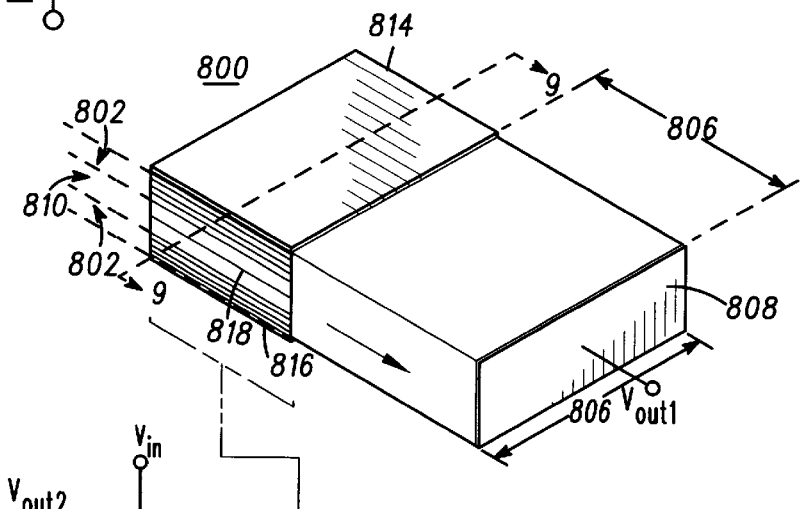
FIG. 8 shows a perspective view of another embodiment of the piezoelectric transformer with multiple output configuration in accordance with the present invention.
Figure 8B:
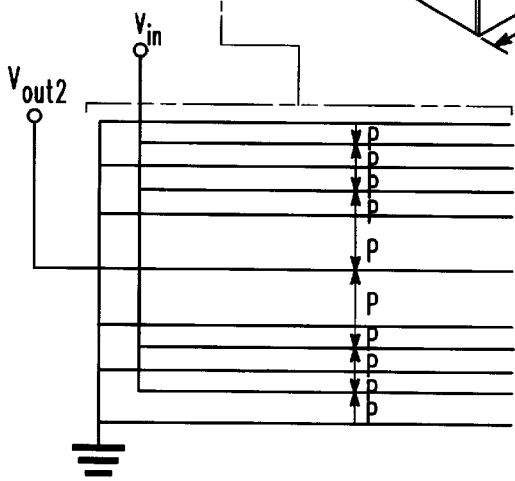

FIG. 8 shows a perspective view of another embodiment of a piezoelectric transformer 800 with a multiple output configuration. In this embodiment, a driving section 802 is made up of a plurality of alternately stacked sheets of green ceramic tape interspersed with electrode layers 804A and 804B. The driving section 802 in this embodiment is located in the top and bottom regions of one end of the piezoelectric transformer 800. The driving section 802 is provided and operates when a voltage (Vin) is applied across the electrode layers 804A and 804B respectively. The driving region is polarized in the direction of its thickness, as indicated by the arrows between the electrode layers 804A and 804B shown in FIG. 8. The top surface 814 of the first driving section 802 is metallized with a conductive coating material. Similarly, the bottom surface 816 of the first driving section 802 is also metallized with a conductive coating material.

A first driven section 806 (also known as a first power generating section) is provided at the other end of piezoelectric transformer 800. Transformer 800 can be fabricated using the same multilayer technology discussed in FIGS. 3 through 7. A first output (Vout1) is formed on the end face 808 of the piezoelectric transformer 800, face 808 also being completely metallized with a metallized conductive coating material. First driven section 806 is polarized in the lengthwise direction, as indicated by the arrow in FIG. 8. The output voltage (Vout1) is generated by the piezoelectric vibration transmitted from the driving section 802.

In this embodiment of the invention, a second driven section 810 is introduced, resulting in a second output voltage (Vout2). Second driven section 810 rests in the middle region of one end of the transformer 800, immediately between the two electrode layer portions 804A and 804B which make up the first driving region 802. A unique feature of this embodiment is that transformer 800 will have an electrical output (Vout2) which is drawn through the middle of the second driven section 810 along a conductive path (electrode layer) 818. Once again, this design offers a different way of producing multiple outputs in a piezoelectric transformer while maintaining a slim, compact, rugged, multilayer package.

It may be advantageous to use the design of FIG. 8, in which the transformer is being driven from both sides (i.e. section 802 is near both surfaces 814 and 816) for applications where the best energy transfer is desired. In other words, the design of FIG. 8 results in a transformer design in which there is higher efficiency in the area of energy transfer, due to the fact that the second output (Vout2) is being driven from both sides, namely the 804A and 804B regions, respectively.

Figure 9:
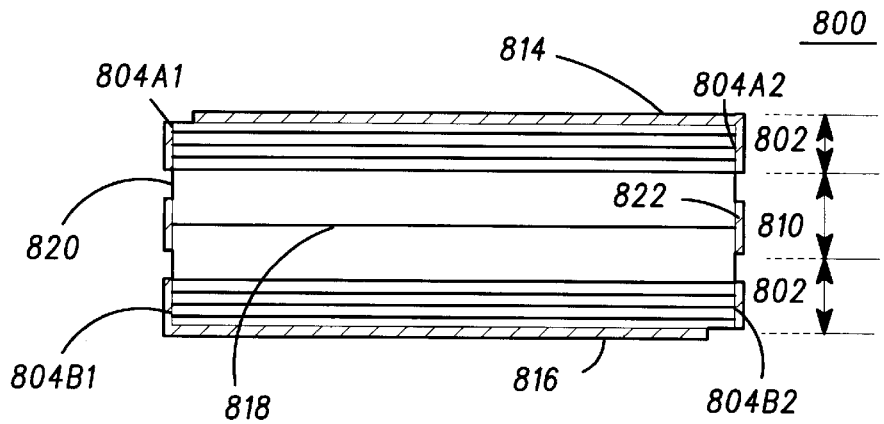
FIG. 9 shows a cross-sectional view, along axis 9—9 of FIG. 8, in accordance with the present invention.

FIG. 9 shows a cross-sectional view, along axis 9—9, of the piezoelectric transformer 800 with multiple output configuration of FIG. 8. In FIG. 8, the interdigitated electrode configuration can be seen. Alternate electrode layers 804A1 and 804A2 are connected to opposite side surfaces of the transformer, 820 and 822 respectively, near the top surface 814 of the transformer 800. Similarly, alternate electrode layers 804B1 and 804B2 are connected to opposite side surfaces of the transformer, 820 and 822 respectively, near the bottom surface 816 of the transformer 800. Side surfaces 820 and 822 are selectively metallized to allow for the necessary electrical grounding of the transformer 800.

Figure 10A:
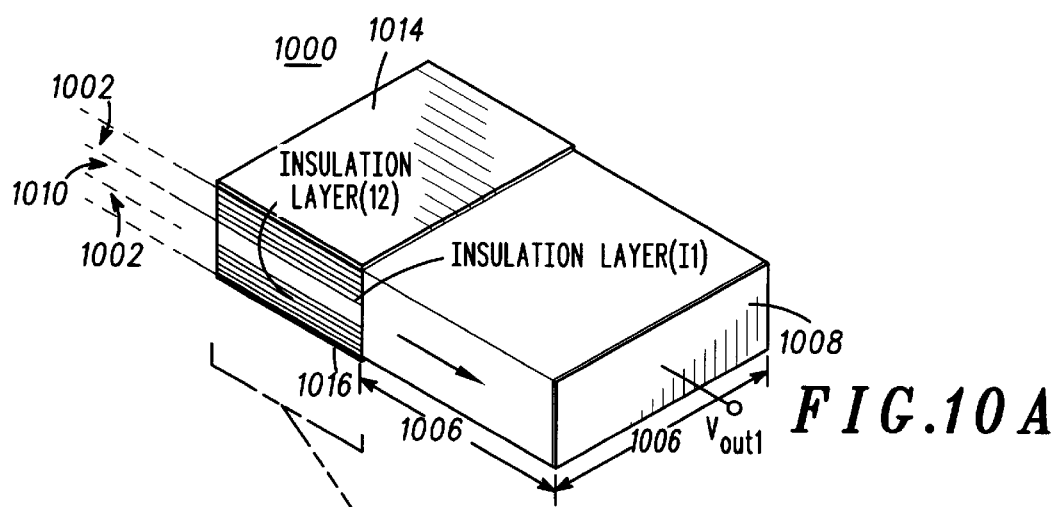
FIG. 10 shows a perspective view of another embodiment of the piezoelectric transformer with multiple output configuration in accordance with the present invention.
Figure 10B:
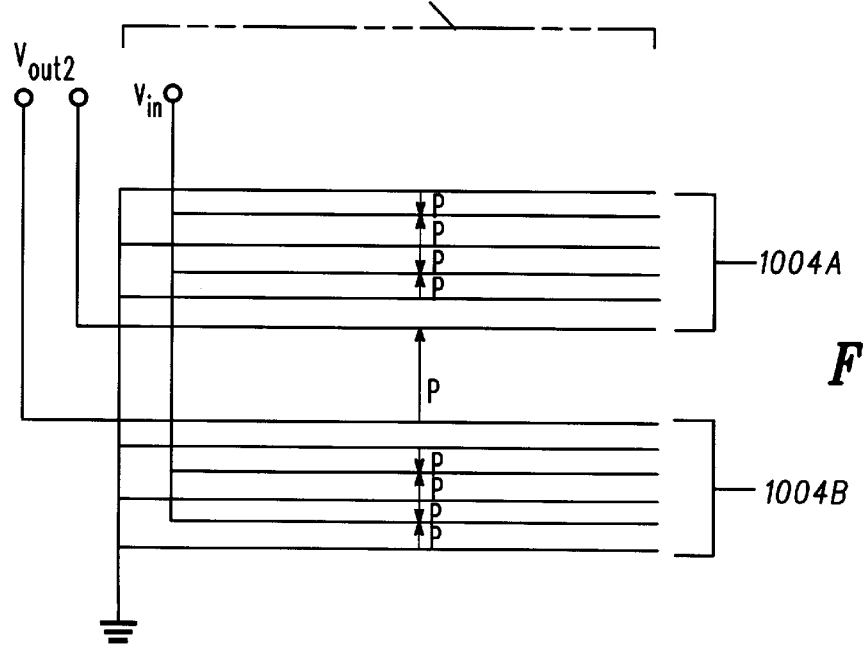

FIG. 10 shows a perspective view of another embodiment of a piezoelectric transformer 1000 with a multiple output configuration. This embodiment is similar to the embodiment of FIG. 8 with some significant differences. In FIG. 10, a driving section 1002 is made up of a plurality of alternately stacked sheets of green ceramic tape interspersed with electrode layers 1004A and 1004B.

The driving section 1002 in this embodiment is located in the top and bottom regions of one end of the piezoelectric transformer 1000. The driving section 1002 is provided and operates when a voltage (Vin) is applied across the electrode layers 1004A and 1004B, respectively. The driving region is polarized in the direction of its thickness, as indicated by the arrows between the electrode layers 1004A and 1004B shown in FIG. 10. The top surface 1014 of the first driving section 1002 is metallized with a conductive coating material. Similarly, the bottom surface 1016 of the first driving section 1002 is also metallized with a conductive coating material.

A first driven section 1006 (also known as a first power generating section) is provided at the other end of piezoelectric transformer 1000. Transformer 1000 can be fabricated using the same multilayer technology discussed in FIGS. 3 through 9. A first output (Vout1) is formed on the end face 1008 of the piezoelectric transformer 1000, face 1008 also being completely metallized with a metallized conductive coating material. First driven section 1006 is polarized in the lengthwise direction, as indicated by the arrow in FIG. 10. The output voltage (Vout1) is generated by the piezoelectric vibration transmitted from the driving section 1002.

In this embodiment of the invention, a second driven section 1010 is introduced, resulting in a second output voltage (Vout2). Second driven section 1010 rests in the middle region of one end of the transformer 1000, immediately between the two electrode layer portions 1004A and 1004B which make up the first driving region 1002. In FIG. 10, the internal electrode layers 1004 and 1004B are designed such that electrical isolation layers 11 and 12 are created. These Isolation layers are similar to those discussed in FIG. 7 and that discussion in incorporated by reference herein.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A piezoelectric ceramic transformer with multiple driven sections providing multiple distinct output voltages, comprising:

a piezoelectric plate made of a piezoelectric ceramic material having a combination Rosen-Transformer/Stack-Transformer geometry and comprising:

a driving section formed by alternately stacking a plurality of piezoelectric ceramic layers polarized in a direction of thickness of the piezoelectric plate, the driving section having internal interdigitated electrode layers for causing piezoelectric vibration by a driving voltage applied to an input terminal;

a first independent driven section longitudinally adjacent to the driving section comprising a plurality of piezoelectric ceramic layers polarized in the longitudinal direction of the piezoelectric plate, for generating a first output voltage at a first output terminal on a first major output surface by the piezoelectric vibration transmitted from the driving section;

a second independent driven section vertically adjacent to the driving section comprising a plurality of piezoelectric ceramic layers polarized in the thickness direction of the piezoelectric plate, for generating a second output voltage at a second output terminal on a second major output surface by the piezoelectric vibration transmitted from the driving section;

the first output voltage and the second output voltage are distinct defining a transformer with multiple driven sections providing multiple distinct output voltages.

2. The transformer of claim 1, further comprising a third independent driven section vertically adjacent to the driving section comprising a plurality of piezoelectric ceramic layers polarized in the thickness direction of the piezoelectric plate, for generating a third output voltage at a third output terminal on a third major output surface by the piezoelectric vibration transmitted from the driving section, and the third output voltage is distinct from the first output voltage and the second output voltage.

3. The transformer of claim 2, further comprising isolation layers between the driving section and the second and third driven sections.

4. The transformer of claim 1, wherein the driving section includes:

a first external electrode formed on at least a first major surface of the driving section of the piezoelectric plate and connected to a first set of alternate interdigitated internal electrode layers and to the first input terminal; and a second external electrode formed on at least a second major surface of the driving section of the piezoelectric plate and connected to a second set of alternate interdigitated internal electrode layers and to a ground.

5. The transformer of claim 1, wherein overall power output is increased by electrically connecting at least the first output voltage and the second output voltage in parallel.

6. The transformer of claim 1, wherein overall voltage output is increased by electrically connecting at least the first output voltage and the second output in series.

7. The transformer of claim 1, wherein the transformer is a reciprocal device and the input and outputs can be reversed.

8. The transformer of claim 1, wherein the piezoelectric ceramic material comprises at least one member of the group consisting of lead titanate, lead titanate-lead zirconate (PbZrO3-PbTiO3), barium titanate, lithium niobate, and equivalents thereof.

9. The transformer of claim 1, wherein the driving section comprises a top driving section and a bottom driving section.

10. The transformer of claim 1, in which the transformer is at least one of a step-up and step-down type transformer.

11. A piezoelectric ceramic transformer with multiple driven sections providing multiple distinct output voltages, comprising:

a piezoelectric plate made of a piezoelectric ceramic material having a combination Rosen-Transformer/Stack-Transformer geometry and comprising:

a driving section formed by alternately stacking a plurality of piezoelectric ceramic layers polarized in a direction of thickness of the piezoelectric plate, the driving section having internal interdigitated electrode layers for causing piezoelectric vibration by a driving voltage applied to an input terminal;

a first independent driven section longitudinally adjacent to the driving section, comprising a plurality of piezoelectric ceramic layers polarized in the longitudinal direction of the piezoelectric plate, for generating a first output voltage at a first output terminal on a first major output surface by the piezoelectric vibration transmitted from the driving section;

a second independent driven section immediately above the driving section, comprising a plurality of piezoelectric ceramic layers polarized in the thickness direction of the piezoelectric plate, for generating a second output voltage at a second output terminal on a second major output surface by the piezoelectric vibration transmitted from the driving section;

a third independent driven section immediately below the driving section, comprising a plurality of piezoelectric ceramic layers polarized in the thickness direction of the piezoelectric plate, for generating a third output voltage at a third output terminal on a third major output surface by the piezoelectric vibration transmitted from the driving section;

the first output voltage and the second output voltage and the third output voltage are distinct defining a transformer with multiple driven sections providing multiple distinct output voltages.

12. The transformer of claim 11, wherein the first independent driven section further comprises a metallized strip substantially around outer surfaces of the first driven section and substantially in proximity to the driving section.

13. The transformer of claim 11, wherein overall power output is increased by electrically connecting at least the first output voltage and the second output voltage in parallel.

14. The transformer of claim 11, wherein overall voltage output is increased by electrically connecting at least the first output voltage and the second output voltage in series.

* * * * *